(12) United States Patent
Winer et al.

(10) Patent No.: US 10,193,304 B2
(45) Date of Patent: Jan. 29, 2019

(54) FAILSAFE PULSED LASER DRIVER

(71) Applicant: Intel Corporation, Santa Clara, CA (US)

(72) Inventors: Paul Winer, Santa Clara, CA (US); Krishna Swaminathan, Santa Clara, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/200,147

(22) Filed: Jul. 1, 2016

(65) Prior Publication Data

US 2018/0006431 A1    Jan. 4, 2018

(51) Int. Cl.
*H01S 5/04*    (2006.01)
*H01S 5/042*   (2006.01)
*H01S 5/42*    (2006.01)
*H01S 5/40*    (2006.01)
*G06T 7/50*    (2017.01)
*H01S 5/068*   (2006.01)

(52) U.S. Cl.
CPC ............. *H01S 5/0428* (2013.01); *G06T 7/50* (2017.01); *H01S 5/40* (2013.01); *H01S 5/42* (2013.01); *H01S 5/06825* (2013.01); *H01S 5/423* (2013.01)

(58) Field of Classification Search
CPC ................................ H01S 5/042; H01S 5/423
See application file for complete search history.

(56) References Cited

U.S. PATENT DOCUMENTS

| | | | | |
|---|---|---|---|---|
| 2007/0142312 A1* | 6/2007 | Werling | ............... | A61K 39/385 514/44 R |
| 2011/0085576 A1* | 4/2011 | Crawford | ........... | H05B 33/0818 372/38.07 |
| 2013/0278151 A1* | 10/2013 | Lear | .................... | H05B 33/0839 315/164 |
| 2014/0204396 A1* | 7/2014 | Giger | .................... | H01S 5/0428 356/614 |
| 2017/0142312 A1* | 5/2017 | Dal Mutto | ......... | H04N 13/0239 |

* cited by examiner

*Primary Examiner* — Armando Rodriguez
(74) *Attorney, Agent, or Firm* — Womble Bond Dickinson (US) LLP

(57) ABSTRACT

A failsafe pulsed laser driver and method for using the same are disclosed. In one embodiment, an apparatus comprises a laser array having a plurality of lasers; and a laser driver coupled to the laser array, wherein the laser driver comprises a current limiter to provide a maximum current at or below a threshold current of lasers in the laser array or at a current level to meet laser safety requirements under circuit failure conditions; one or more capacitors coupled to current limiter and the laser array, the one or more capacitors to be charged in response to current from the current limiter; and a switch coupled to the one or more capacitors operable to cause current from the one or more capacitors to flow through the laser array.

21 Claims, 9 Drawing Sheets

FIG. 4 (Continued) →

FAILSAFE PULSED LASER DRIVER

FIELD OF THE INVENTION

Embodiments of the present invention are related to lasers for use in camera systems; more particularly, embodiments of the present invention are related to laser drivers for use in driving such lasers.

BACKGROUND

Stereoscopic systems can be used to image objects in three dimensions (3D) to create images that provide a description of the world where each pixel is defined as have Red-Green-Blue (RGB) and depth values. Such systems often include a projector and two or more cameras. The projector projects a known spatially varying intensity pattern on an object (e.g., a scene), and an image of the object upon which the image is projected is captured by the cameras. From the captured images, depth information may be determined. One technique for determining depth in such devices is through the use of triangulation. Thus, images of objects are captured and measurements are taken to determine depth information. These 3D systems are known as an "Assisted 3D Stereoscopic Depth Camera", and an example of an Intel® RealSense™ R200 Camera.

The projector in the stereoscopic system may be a vertical cavity surface emitter laser (VCSEL)-based infrared (IR) projector. A VCSEL-based IR projection contains a laser "chip" consisting of thousands of individual lasers operated in parallel. Each laser requires a minimum current, known as a threshold current, before laser emission is observed. In order to operate the laser efficiently, the laser should operate at many times the threshold current.

Further, although the laser current required for an individual VCSEL is modest, the current required for thousands of lasers in parallel can be several amps (e.g., 10 amps). A continuous light output at this high current level represents a significant eye hazard. The average laser output must meet the needs of the 3D camera and meet the needs for an eye safe level to meet Food and Drug Administration (FDA) class 1 laser requirements which is required for certain applications. Besides meeting operating requirements for class 1 operation, the laser system must also be safe even when the circuit has single point failure.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
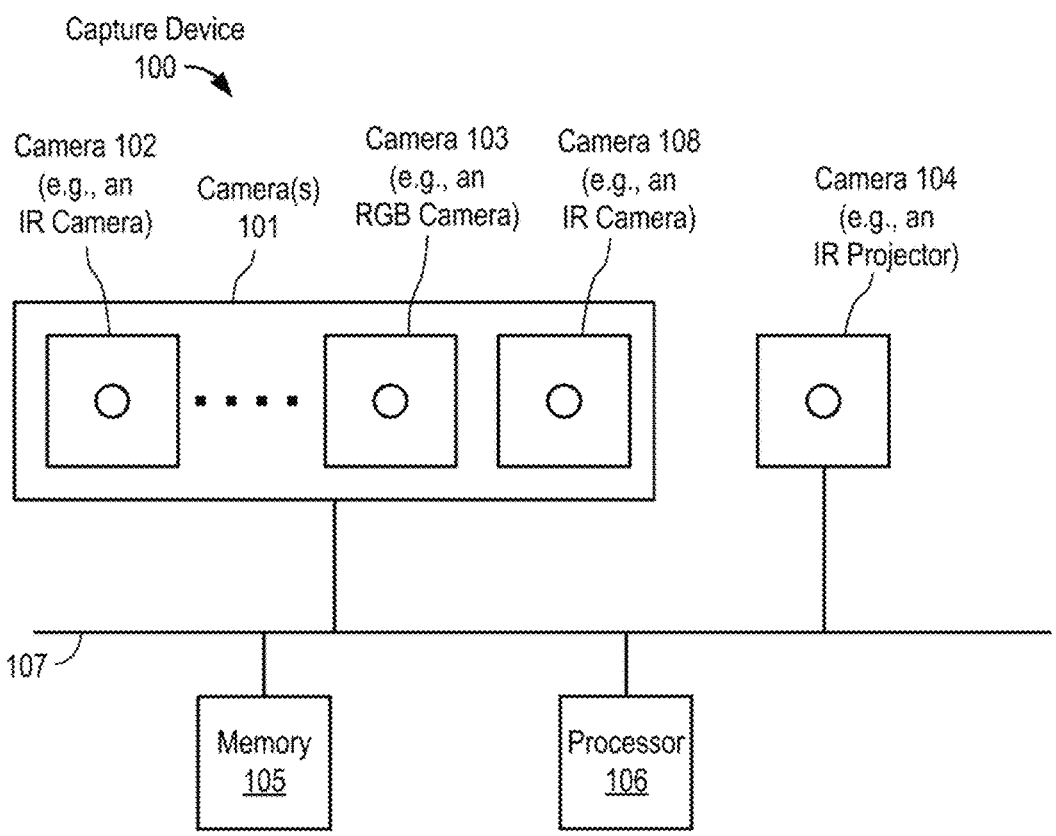
FIG. 1 illustrates one embodiment of a camera system.

FIG. 1 illustrates one embodiment of a stereoscopic camera system. The system includes projects a dot pattern onto a scene using a projector and captures images of the projected dot pattern to produce depth information therefrom. The depth information may be determined using well-known techniques such as, for example, triangulation or disparity of distance.

Referring to FIG. 1, capture device 100 may include a 3D scanner, one or more 3D cameras 101 or any other device configured for a 3D object acquisition. In some embodiments, as illustrated, capture device 100 includes multiple image capturing cameras (e.g., an image capturing device 102 (e.g., a digital infrared (IR) camera), image capturing device 103 (e.g., a digital color camera), image capturing device 108 (e.g., a digital IR camera), etc.) and a projector unit 104, such as a laser projector or laser scanner, having a number of components. In some embodiments, the projector unit 104 may comprise an IR projector.

Projector unit 104 is configured to project a dot pattern. The dot pattern formed by projector unit 104 on a surface of the object may be received by image capturing devices 102 and 108 via sensing by a sensor of image capturing devices 102 and 108. Based on the captured images, capture device 100 may be configured to reconstruct the shape of the object.

In some embodiments, capture device 100 may further include another image capturing device, such as digital camera 103. In some embodiments, digital camera 103 may have a resolution that is different than that of digital cameras 102 and 108. For example, digital camera 103 may be a multi-chromatic camera, such as red, green, and blue (RGB) camera configured to capture texture images of an object.

Figure 2:
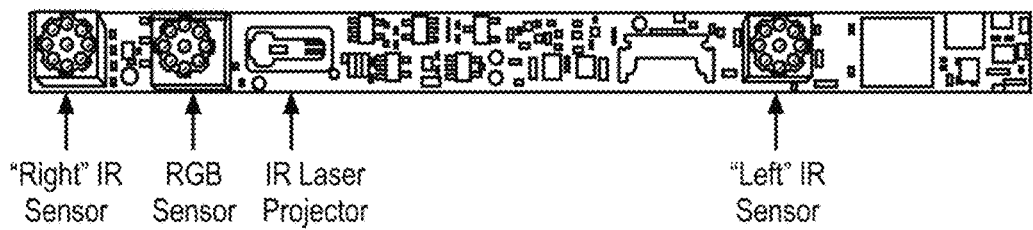
FIG. 2 illustrates one embodiment of a stereoscopic camera system.

In one embodiment, capture device 100 comprises an IR projector, an RGB camera (e.g., sensor) and two IR cameras (e.g., sensors) coupled to a printer circuit board (PCB) as shown in FIG. 2.

Capture device 100 may further include a processor 106 that may be in operative communication with the image camera component 101 over a bus or interconnect 107. Processor 106 may include a standardized processor, a specialized processor, a microprocessor, or the like that may execute instructions that may include instructions for generating depth information, generating a depth image, determining whether a suitable target may be included in the depth image, or performing other operations described herein.

Processor 106 may be configured to reconstruct the object based on the images captured by digital camera 102, for example, using geometry techniques or other techniques used for 3D image reconstruction.

Capture device 100 may further include a memory 105 that may store the instructions that may be executed by processor 106, images or frames of images captured by the cameras, user profiles or any other suitable information, images, or the like. According to one example, memory 105 may include random access memory (RAM), read only memory (ROM), cache, Flash memory, a hard disk, or any other suitable storage component. As shown in FIG. 1, memory component 105 may be a separate component in communication with the cameras 101 and processor 106. Alternatively, memory 105 may be integrated into processor 106 and/or the image capture cameras 101. In one embodiment, some or all of the components 102-106 are located in a single housing.

Processor 105, memory 104, other components (not shown), image capturing device 102, and projector unit 104 may be coupled with one or more interfaces (not shown) configured to facilitate information exchange among the above-mentioned components. Communications interface(s) (not shown) may provide an interface for device 100 to communicate over one or more wired or wireless network(s) and/or with any other suitable device. In various embodiments, capture device 100 may be included to or associated with, but is not limited to, a server, a workstation, a desktop computing device, or a mobile computing device (e.g., a laptop computing device, a handheld computing device, a handset, a tablet, a smartphone, a netbook, ultrabook, etc.).

In one embodiment, capture device 100 is integrated into a computer system (e.g., laptop, personal computer (PC), etc.). However, capture device 100 can be alternatively configured as a standalone device that is couplable to such a computer system using conventional technologies including both wired and wireless connections.

In various embodiments, capture device 100 may have more or less components, and/or different architectures. For example, in some embodiments, capture device 100 may include one or more of a camera, a keyboard, display such as a liquid crystal display (LCD) screen (including touch screen displays), a touch screen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, capture device 100 may have more or less components, and/or different architectures. In various embodiments, techniques and configurations described herein may be used in a variety of systems that benefit from the principles described herein.

Capture device 100 may be used for a variety of purposes, including, but not limited to, being part of a target recognition, analysis, and tracking system to recognize human and non-human targets in a capture area of the physical space without the use of special sensing devices attached to the subjects, uniquely identify them, and track them in three-dimensional space. Capture device 100 may be configured to capture video with depth information including a depth image that may include depth values via any suitable technique including, for example, triangulation, disparity of distance, time-of-flight, structured light, stereo image, or the like.

Capture device 100 may be configured to operate as a depth camera that may capture a depth image of a scene. The depth image may include a two-dimensional (2D) pixel area of the captured scene where each pixel in the 2D pixel area may represent a depth value such as a distance in, for example, centimeters, millimeters, or the like of an object in the captured scene from the camera. In this example, capture device 100 includes an IR light projector 404, an IR camera 102, an IR camera 108, and a visible light RGB camera 103 that are configured in an array.

Various techniques may be utilized to capture depth video frames. For example, capture device 100 may use structured light to capture depth information. In such an analysis, light displayed as a known dot pattern may be projected onto the capture area via, for example, IR light projector 104. Capture device 100 may utilize two or more physically separated cameras that may view a capture area from different angles, to obtain visual stereo data that may be resolved to generate depth information (e.g., a depth map). The depth information may be generated using known techniques, such as, for example, triangulation or disparity of distance. Other types of depth image arrangements using single or multiple cameras can also be used to create a depth image.

Capture device 100 may provide the depth information and images captured by, for example, IR camera 102, IR camera 108, and/or the RGB camera 103, including a skeletal model and/or facial tracking model that may be generated by capture device 100, where the skeletal and/or facial tracking models, depth information, and captured images are used to, for example, create a virtual screen, adapt the user interface, and control an application.

In summary, capture device 100 may comprise a projector unit 104, a digital camera (e.g., IR camera) 102, a digital camera (e.g., IR camera) 108, another digital camera (e.g., multi-chromatic camera) 103, and a processor (controller) configured to operate capture device 100 according to the embodiments described herein. However, the above assembly configuration is described for illustration purposes only, and is should not be limiting to the present disclosure. Various configurations of an assembly for a 3D object acquisition may be used to implement the embodiments described herein. For example, an assembly for a 3D object acquisition configured to enable the reconstructed object distortion corrections may include three digital cameras, two of which may be used to reconstruct a 3D image of an object, and the third camera (e.g. with a resolution that is different than those of the two cameras) may be used to capture images of the object in order to identify image distortions in the reconstructed object and to compensate for identified distortions.

IR Projector

As discussed above, a coded light camera comprising a projector 104 (e.g., an IR projector) projects a dot pattern onto the scene, and an IR cameras 102 and 108 capture the dot pattern. In one embodiment, the processing unit is operable to generate a depth value based on the new projector location coordinate and a camera location coordinate.

Figure 3:
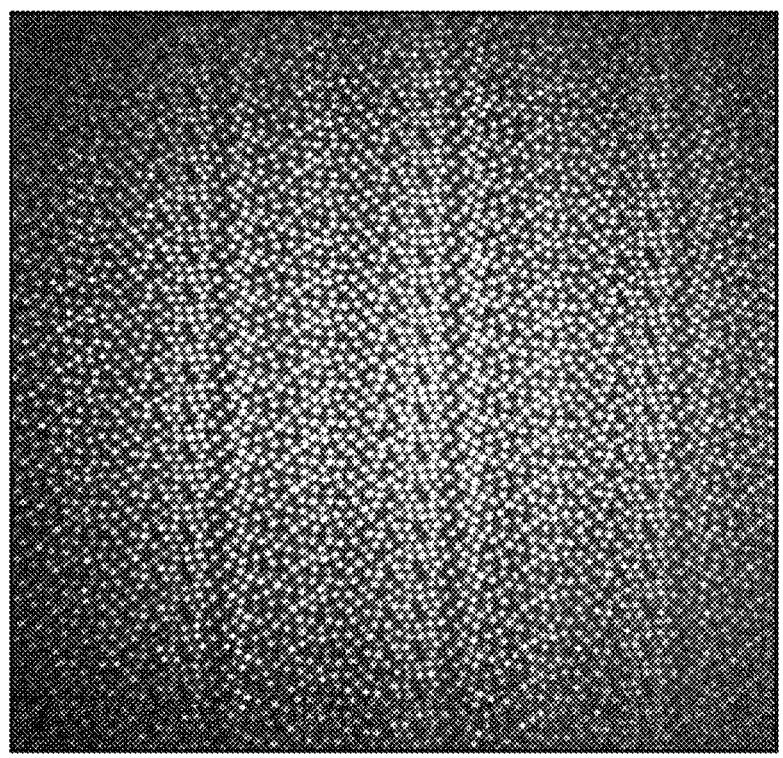
FIG. 3 illustrates an example of an IR projected pattern.

In one embodiment, the IR projector comprises a vertical cavity surface emitting laser (VCSEL) array based pattern projector having a VCSEL array that projects an IR projected pattern. FIG. 3 illustrates an example of an IR projected pattern.

In one embodiment, a laser driver drives the VCSEL array. In one embodiment, the driver drives the array with high current pulses in an inherently failsafe manner. In one embodiment, the laser driver comprises a capacitor that is charged through a current limiting circuit or other component. In one embodiment, the capacitor is a small value capacitor. In one embodiment, the capacitor comprises multiple capacitors that are coupled together. A switch (e.g., a transistor (e.g., a metal-oxide-semiconductor field-effect transistor (MOSFET))) is coupled to the capacitor to discharge the capacitor into the laser array. In one embodiment, the switch is a high current switch. In one embodiment, the laser driver comprises a timing circuit that controls the pulse width and pulse period of the current pulse discharged from the capacitor.

In one embodiment, the driver has a number of failsafe features. The first failsafe feature is provided by the size of the capacitor. The capacitor limits the total energy that can be discharged into the VCSEL array. If the timing circuit or the pass transistor fail, the maximum energy that could be discharged into the VCSEL array would be limited by the size of the capacitor.

The second failsafe feature is a current limited circuit that charges the capacitor. In one embodiment, the current limited circuit is set to provide a maximum current at or below the combined threshold current of the laser. In one embodiment, the VCSELs in the array are connected in parallel. Therefore, the combined threshold current refers to the sum of the threshold current for each individual VCSEL. If the timing circuit or the switch (e.g., the MOSFET transistor) fails, the current through the VCSEL array would not produce an intense laser light.

Since one embodiment of the laser driver circuit is designed to be inherently failsafe, additional circuits are not required to ensure class 1 laser safety.

Figure 4:
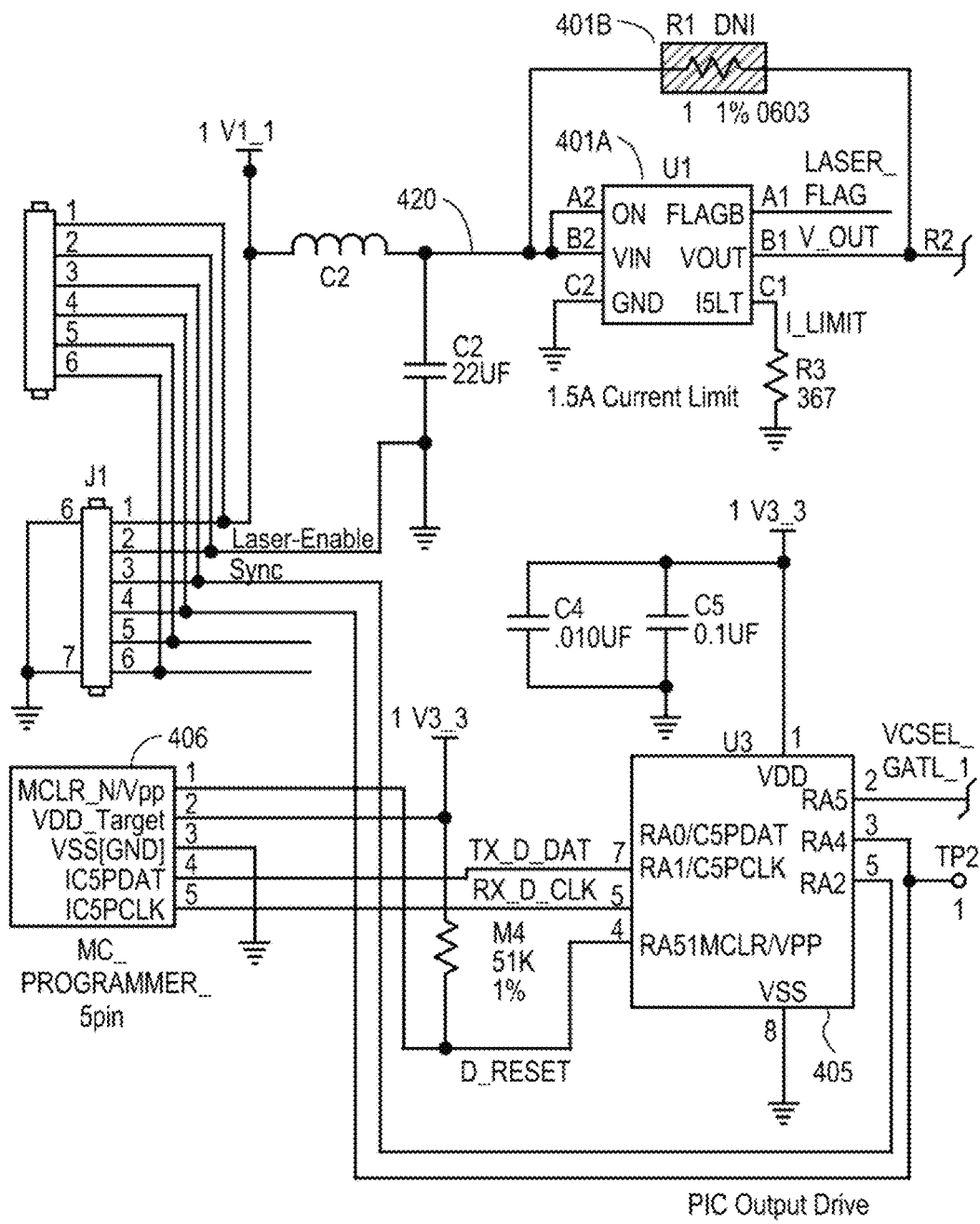
FIG. 4 is a circuit schematic of one embodiment of a laser driver.
Figure 4:
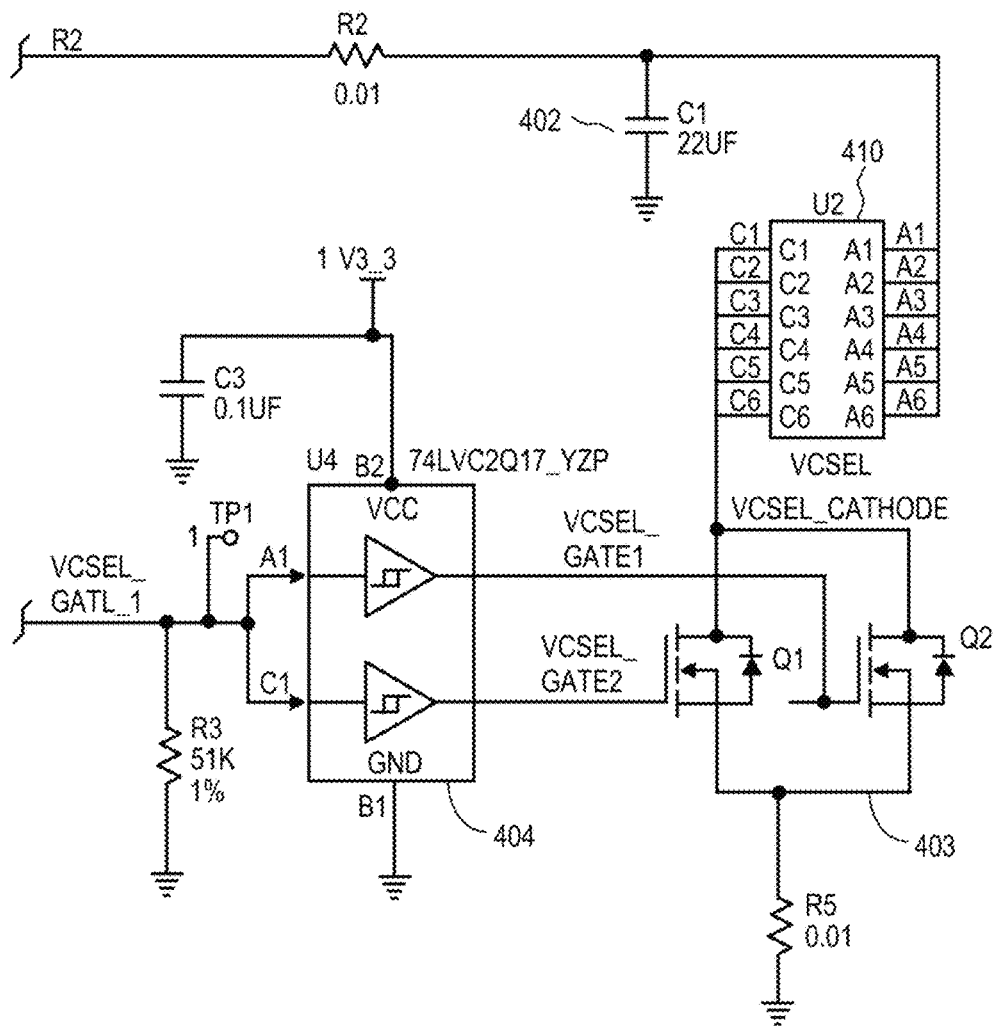

FIG. 4 is a circuit schematic of one embodiment of a laser driver. Referring to FIG. 4, current limiting circuit 401A receives current from an input 420 and provides the current to capacitor 402. If the current is higher than a predetermined limit, then current limiting circuit 401A prevents the current from passing to capacitor 402. In one embodiment, current limiting circuit 401A limits the current that goes into VSCEL array 410 to at or below the threshold current of sum of the VCSELs in VCSEL array 410. Thus, current limiting circuit 401A limits the peak current to the VCSEL-based platform. In one embodiment, current limiting circuit 401A comprises a current limited load switch. In another embodiment, current limiting circuit is a resistor 401B.

Capacitor 402 is coupled to current limiting circuit 401A and charges in response to current from current limiting circuit 401A. Based on its size, capacitor 402 is limited in the amount of total energy it delivers to VCSEL array 410. When discharging, capacitor 403 provides a high current pulse to VCSEL array 410. In one embodiment, the current pulse is strong so that a very large amount of light is provided by VCSEL array 410 but for a very short duration of time. The amount of energy available is a function of the charge of capacitor 402, which is based on its size and the amount of voltage put on it.

Note that capacitor 402 is shown as a single capacitor. However, capacitor 402 may comprise multiple capacitors coupled together to provide a single capacitance. In one embodiment, capacitor 402 comprises a 22 µF capacitor. In another embodiment, capacitor 402 comprises a 40 µF capacitor. In one embodiment, the capacitor selected for use is sized to provide an amount of energy beyond the threshold current of the VCSEL array being used to have VCSEL array provide a predetermined amount of illumination for a desired period of time (e.g., time to project a pattern on an object).

Figure 5:
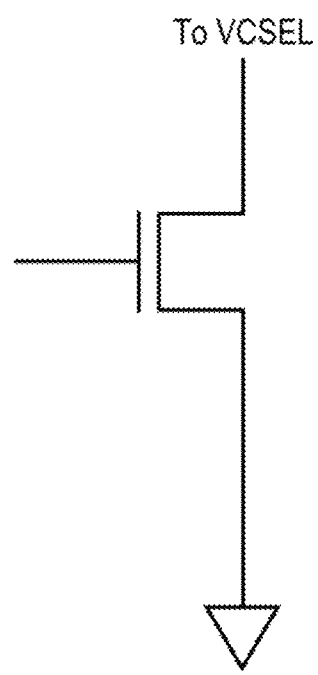
FIG. 5 is an example of a single metal-oxide-semiconductor field-effect transistor (MOSFET) for use in discharging the one or more capacitors to provide a power pulse to a laser array (e.g., VCSEL array).

Switch 403 is coupled to VCSEL array 410 and causes capacitor 402 to discharge capacitor 403 into VCSEL array 410 when switch 403 is closed (i.e., on). In one embodiment, switch 403 comprises two (or more) transistors coupled in parallel between VCSEL array 410 and ground. This arrangement may be useful to provide a switch with lower resistance than if a single transistor is used. In alternative embodiment, switch 403 comprises a single MOSFET, such as shown in FIG. 5.

Timing circuit 405 controls when capacitor 402 discharges. In one embodiment, timing circuit 405 controls the discharge of capacitor 402 by controlling switch 403. In one embodiment, timing circuit 405 adjusts the illumination intensity provided by VCSEL array 410. In one embodiment, timing circuit 405 controls the illumination intensity by controlling the pulse width (or duty cycle) and pulse period of the current pulse discharged from capacitor 402. In one embodiment, timing circuit 405 is programmed based on the size of capacitor 402 and the amount of voltage used to charge capacitor 402, as well as the duration of illumination desired.

Note that the laser driver circuit also includes an optional gate driver 404 to boost the level of signals output from timing circuit 405. This may be used to drive a much larger current to switch 403 than is possible with the output signal(s) of timing circuit 405.

Note that the circuit schematics shows other components the operation of which would be well understood by those in the art. For example, there are connectors shown in FIG. 4, which are used for test and are not necessary for some embodiments. One such connector is connector 406 that is used to load firmware into the microprocessor and to help debug the firmware. In one embodiment, this feature is optional and not needed during the normal operation of the laser driver circuit. These components have not been described in detail in order to avoid obscuring the present invention.

In one embodiment, multiple regions on the VCSEL array are operated by multiple laser drivers. For example, there may be three independent regions of the array, one on the left, one in the center, and one on the right, that are each driven separately. In one embodiment, only the central region is illuminated when a wide view is not needed. This saves power. Also, the regions could be illuminated in an interleaving manner to support power saving on a rolling shutter camera. Furthermore, the VCSELs could be driven in an interleaved manner to obtain different resolutions.

In one embodiment, the laser driver circuit also present a low peak current load to the rest of the system, making the power delivery requirements friendly to mobile platforms.

Figure 6:
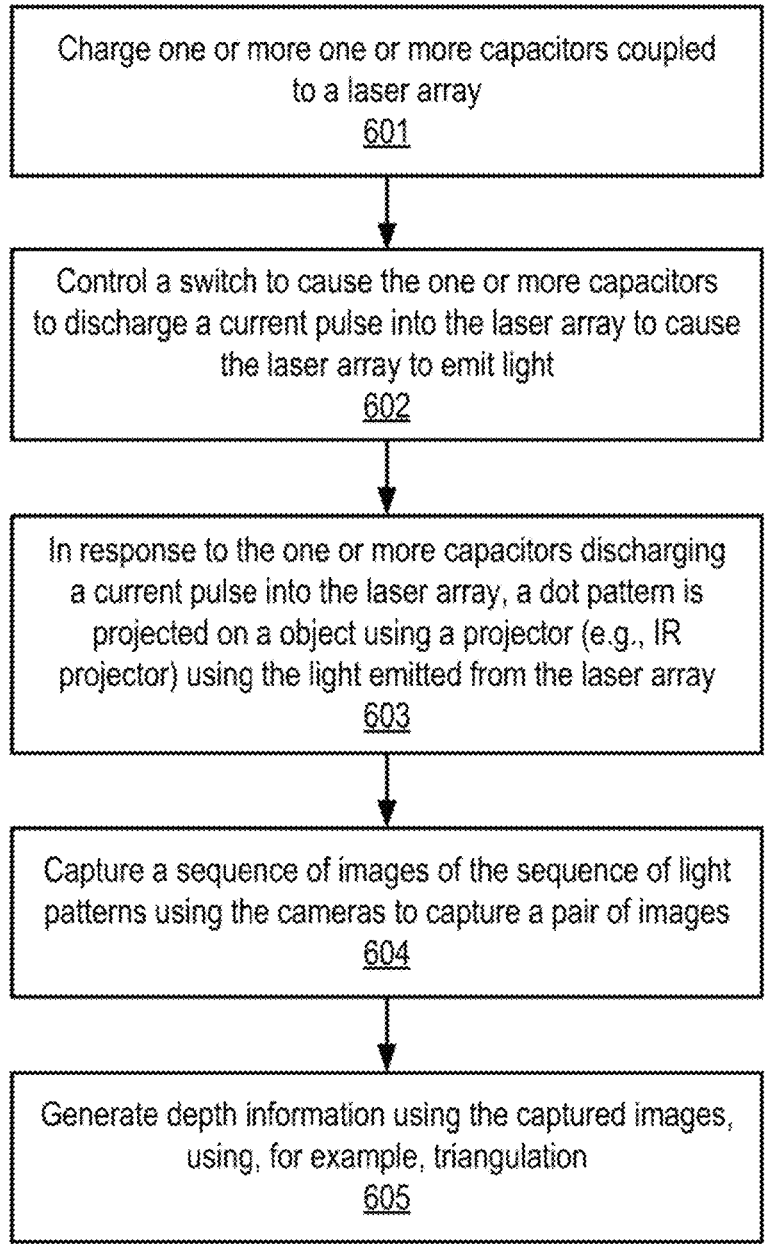
FIG. 6 is a flow diagram of one embodiment of a process for generating depth values.

FIG. 6 is a flow diagram of one embodiment of a process for generating depth values. The process is performed by processing logic that may comprises hardware, software, firmware or a combination of the three.

Referring to FIG. 6, the process begins by charging one or more one or more capacitors coupled to a laser array (processing block 601). In one embodiment, the laser array comprises a vertical cavity surface emitting laser (VCSEL) array comprising a plurality of VCSELs.

Next, a controller controls a switch to cause the one or more capacitors to discharge a current pulse into the laser array to cause the laser array to emit light (processing block 602). In one embodiment, this includes controlling pulse width and pulse duration of the current pulse by controlling the switch.

In response to the one or more capacitors discharging a current pulse into the laser array, a dot pattern is projected on an object using a projector (e.g., IR projector) using the light emitted from the laser array (processing block 603).

The cameras captures a pair of images (processing block 604) and depth information is generated using the captured images, using, for example, triangulation (processing block 605).

Figure 7:
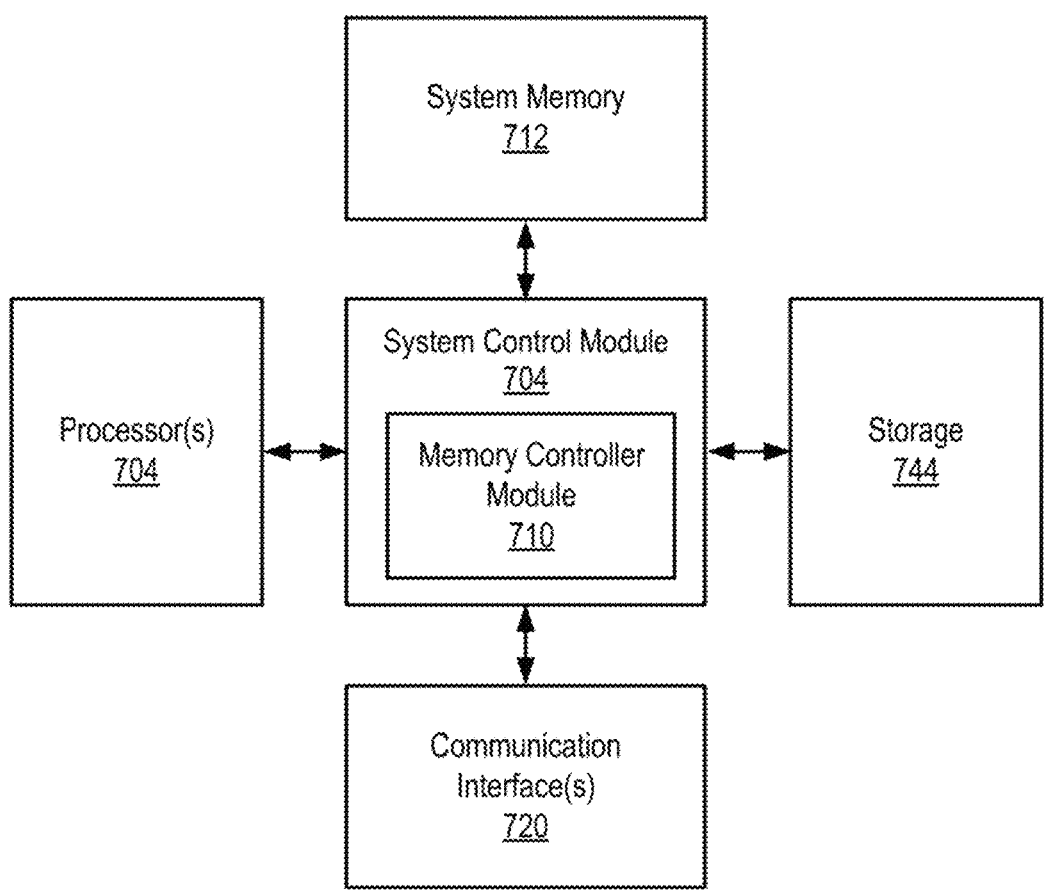
FIG. 7 is a block diagram of one embodiment of a system.

FIG. 7 illustrates, for one embodiment, an example system 700 having one or more processor(s) 704, system control module 708 coupled to at least one of the processor(s) 704, system memory 712 coupled to system control module 708, non-volatile memory (NVM)/storage 714 coupled to system control module 708, and one or more communications interface(s) 720 coupled to system control module 708.

In some embodiments, the system 700 may include one or more computer-readable media (e.g., system memory or NVM/storage 714) having instructions and one or more processors (e.g., processor(s) 704) coupled with the one or more computer-readable media and configured to execute the instructions to implement a module to perform image distortion correction calculation actions described herein.

System control module 708 for one embodiment may include any suitable interface controllers to provide for any suitable interface to at least one of the processor(s) 704 and/or to any suitable device or component in communication with system control module 708.

System control module 708 may include memory controller module 710 to provide an interface to system memory 712. The memory controller module 710 may be a hardware module, a software module, and/or a firmware module. System memory 712 may be used to load and store data and/or instructions, for example, for system 700. System memory 712 for one embodiment may include any suitable volatile memory, such as suitable DRAM, for example. System control module 708 for one embodiment may include one or more input/output (I/O) controller(s) to provide an interface to NVM/storage 714 and communications interface(s) 720.

The NVM/storage 714 may be used to store data and/or instructions, for example. NVM/storage 714 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example. The NVM/storage 714 may include a storage resource physically part of a device on which the system 700 is installed or it may be accessible by, but not necessarily a part of, the device. For example, the NVM/storage 714 may be accessed over a network via the communications interface(s) 720.

Communications interface(s) 720 may provide an interface for system 700 to communicate over one or more network(s) and/or with any other suitable device. The system 700 may wirelessly communicate with the one or more components of the wireless network in accordance with any of one or more wireless network standards and/or protocols.

For one embodiment, at least one of the processor(s) 704 may be packaged together with logic for one or more controller(s) of system control module 708, e.g., memory controller module 710. For one embodiment, at least one of the processor(s) 704 may be packaged together with logic for one or more controllers of system control module 708 to form a System in Package (SiP). For one embodiment, at least one of the processor(s) 704 may be integrated on the same die with logic for one or more controller(s) of system control module 708. For one embodiment, at least one of the processor(s) 704 may be integrated on the same die with logic for one or more controller(s) of system control module 708 to form a System on Chip (SoC).

In various embodiments, the system 700 may have more or less components, and/or different architectures. For example, in some embodiments, the system 700 may include one or more of a camera, a keyboard, liquid crystal display (LCD) screen (including touch screen displays), non-volatile memory port, multiple antennas, graphics chip, application-specific integrated circuit (ASIC), and speakers.

In various implementations, the system 700 may be, but is not limited to, a mobile computing device (e.g., a laptop computing device, a handheld computing device, a tablet, a netbook, etc.), a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 700 may be any other electronic device.

Figure 8:
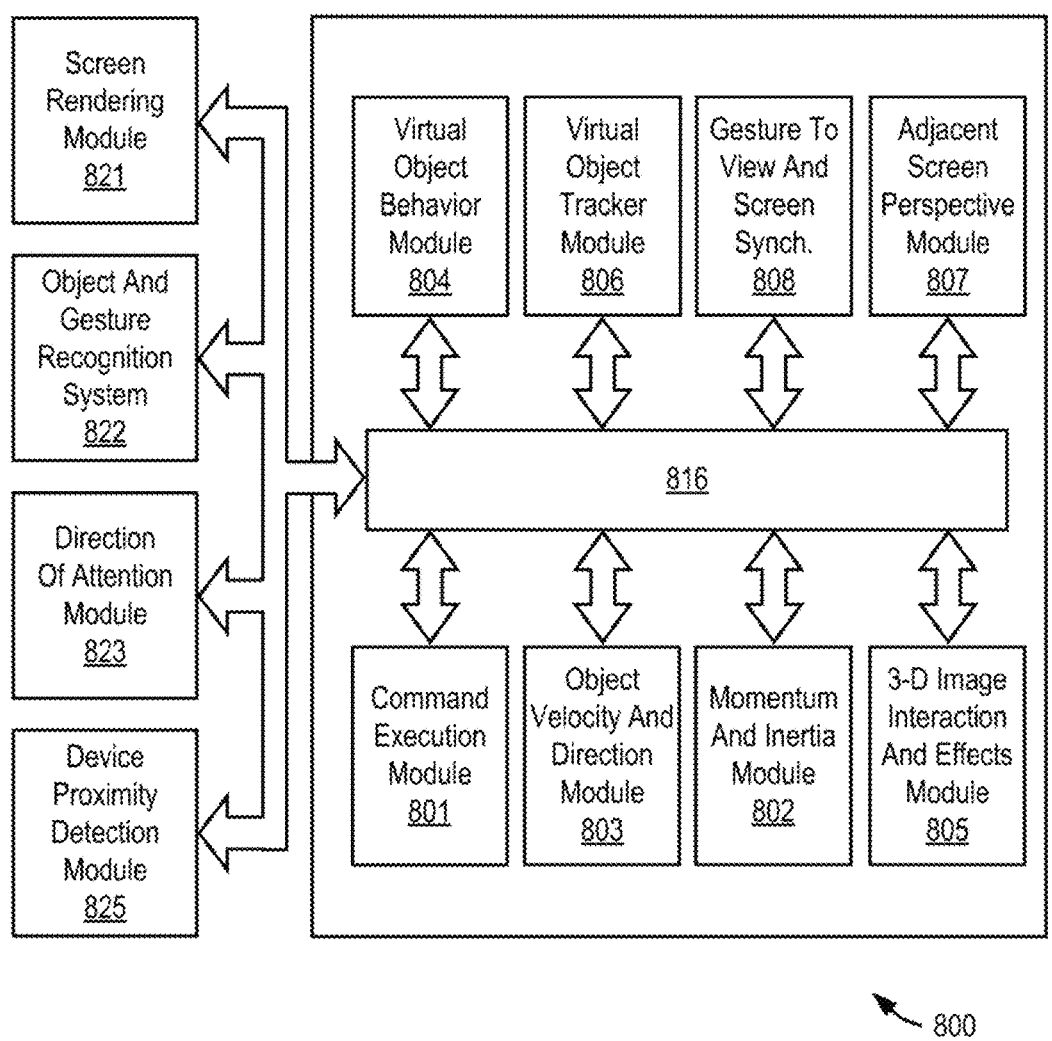
FIG. 8 illustrates an embodiment of a computing environment capable of supporting the operations described herein.

FIG. 8 illustrates an embodiment of a computing environment 800 capable of supporting the operations discussed above. The modules described before can use the depth information (e.g., values) and other data described above to perform these functions. The modules and systems can be implemented in a variety of different hardware architectures and form factors.

Command Execution Module 801 includes a central processing unit to cache and execute commands and to distribute tasks among the other modules and systems shown. It may include an instruction stack, a cache memory to store intermediate and final results, and mass memory to store applications and operating systems. Command Execution Module 801 may also serve as a central coordination and task allocation unit for the system.

Screen Rendering Module 821 draws objects on the one or more multiple screens for the user to see. It can be adapted to receive the data from Virtual Object Behavior Module 804, described below, and to render the virtual object and any other objects and forces on the appropriate screen or screens. Thus, the data from Virtual Object Behavior Module 804 would determine the position and dynamics of the virtual object and associated gestures, forces and objects, for example, and Screen Rendering Module 821 would depict the virtual object and associated objects and environment on a screen, accordingly. Screen Rendering Module 821 could further be adapted to receive data from Adjacent Screen Perspective Module 807, described below, to either depict a target landing area for the virtual object if the virtual object could be moved to the display of the device with which Adjacent Screen Perspective Module 807 is associated. Thus, for example, if the virtual object is being moved from a main screen to an auxiliary screen, Adjacent Screen Perspective Module 807 could send data to the Screen Rendering Module 821 to suggest, for example in shadow form, one or more target landing areas for the virtual object on that track to a user's hand movements or eye movements.

Object and Gesture Recognition System 822 may be adapted to recognize and track hand and harm gestures of a user. Such a module may be used to recognize hands, fingers, finger gestures, hand movements and a location of hands relative to displays. For example, Object and Gesture Recognition System 822 could for example determine that a user made a body part gesture to drop or throw a virtual object onto one or the other of the multiple screens, or that the user made a body part gesture to move the virtual object to a bezel of one or the other of the multiple screens. Object and Gesture Recognition System 822 may be coupled to a camera or camera array, a microphone or microphone array, a touch screen or touch surface, or a pointing device, or some combination of these items, to detect gestures and commands from the user.

The touch screen or touch surface of Object and Gesture Recognition System 822 may include a touch screen sensor. Data from the sensor may be fed to hardware, software, firmware or a combination of the same to map the touch gesture of a user's hand on the screen or surface to a corresponding dynamic behavior of a virtual object. The sensor date may be used to momentum and inertia factors to allow a variety of momentum behavior for a virtual object based on input from the user's hand, such as a swipe rate of a user's finger relative to the screen. Pinching gestures may be interpreted as a command to lift a virtual object from the display screen, or to begin generating a virtual binding associated with the virtual object or to zoom in or out on a display. Similar commands may be generated by Object and Gesture Recognition System 822, using one or more cameras, without the benefit of a touch surface.

Direction of Attention Module 823 may be equipped with cameras or other sensors to track the position or orientation of a user's face or hands. When a gesture or voice command is issued, the system can determine the appropriate screen for the gesture. In one example, a camera is mounted near each display to detect whether the user is facing that display. If so, then the direction of attention module information is provided to Object and Gesture Recognition Module 822 to ensure that the gestures or commands are associated with the appropriate library for the active display. Similarly, if the user is looking away from all of the screens, then commands can be ignored.

Device Proximity Detection Module 825 can use proximity sensors, compasses, GPS (global positioning system) receivers, personal area network radios, and other types of sensors, together with triangulation, disparity of distance, and other techniques to determine the proximity of other devices. Once a nearby device is detected, it can be registered to the system and its type can be determined as an input device or a display device or both. For an input device, received data may then be applied to Object Gesture and Recognition System 822. For a display device, it may be considered by Adjacent Screen Perspective Module 807.

Virtual Object Behavior Module 804 is adapted to receive input from Object Velocity and Direction Module 803, and to apply such input to a virtual object being shown in the display. Thus, for example, Object and Gesture Recognition System 822 would interpret a user gesture and by mapping the captured movements of a user's hand to recognized movements, Virtual Object Tracker Module 806 would associate the virtual object's position and movements to the movements as recognized by Object and Gesture Recognition System 822, Object and Velocity and Direction Module 803 would capture the dynamics of the virtual object's movements, and Virtual Object Behavior Module 804 would receive the input from Object and Velocity and Direction Module 803 to generate data that would direct the movements of the virtual object to correspond to the input from Object and Velocity and Direction Module 803.

Virtual Object Tracker Module 806 on the other hand may be adapted to track where a virtual object should be located in three-dimensional space in a vicinity of a display, and which body part of the user is holding the virtual object, based on input from Object Gesture and Recognition System 822. Virtual Object Tracker Module 806 may for example track a virtual object as it moves across and between screens and track which body part of the user is holding that virtual object. Tracking the body part that is holding the virtual object allows a continuous awareness of the body part's air movements, and thus an eventual awareness as to whether the virtual object has been released onto one or more screens.

Gesture to View and Screen Synchronization Module 808, receives the selection of the view and screen or both from Direction of Attention Module 823 and, in some cases, voice commands to determine which view is the active view and which screen is the active screen. It then causes the relevant gesture library to be loaded for Object and Gesture Recognition System 822. Various views of an application on one or more screens can be associated with alternative gesture libraries or a set of gesture templates for a given view.

Adjacent Screen Perspective Module 807, which may include or be coupled to Device Proximity Detection Module 825, may be adapted to determine an angle and position of one display relative to another display. A projected display includes, for example, an image projected onto a wall or screen. The ability to detect a proximity of a nearby screen and a corresponding angle or orientation of a display projected therefrom may for example be accomplished with either an infrared emitter and receiver, or electromagnetic or photo-detection sensing capability. For technologies that allow projected displays with touch input, the incoming video can be analyzed to determine the position of a projected display and to correct for the distortion caused by displaying at an angle. An accelerometer, magnetometer, compass, or camera can be used to determine the angle at which a device is being held while infrared emitters and cameras could allow the orientation of the screen device to be determined in relation to the sensors on an adjacent device. Adjacent Screen Perspective Module 807 may, in this way, determine coordinates of an adjacent screen relative to its own screen coordinates. Thus, the Adjacent Screen Perspective Module may determine which devices are in proximity to each other, and further potential targets for moving one or more virtual object's across screens. Adjacent Screen Perspective Module 807 may further allow the position of the screens to be correlated to a model of three-dimensional space representing all of the existing objects and virtual objects.

Object and Velocity and Direction Module 803 may be adapted to estimate the dynamics of a virtual object being moved, such as its trajectory, velocity (whether linear or angular), momentum (whether linear or angular), etc. by receiving input from Virtual Object Tracker Module 806. The Object and Velocity and Direction Module 803 may further be adapted to estimate dynamics of any physics forces, by for example estimating the acceleration, deflection, degree of stretching of a virtual binding, etc. and the dynamic behavior of a virtual object once released by a user's body part. Object and Velocity and Direction Module 803 may also use image motion, size and angle changes to estimate the velocity of objects, such as the velocity of hands and fingers Momentum and Inertia Module 802 can use image motion, image size, and angle changes of objects in the image plane or in a three-dimensional space to estimate the velocity and direction of objects in the space or on a display. Momentum and Inertia Module 802 is coupled to Object and Gesture Recognition System 822 to estimate the velocity of gestures performed by hands, fingers, and other body parts and then to apply those estimates to determine momentum and velocities to virtual objects that are to be affected by the gesture.

3D Image Interaction and Effects Module 805 tracks user interaction with 3D images that appear to extend out of one or more screens. The influence of objects in the z-axis (towards and away from the plane of the screen) can be calculated together with the relative influence of these objects upon each other. For example, an object thrown by a user gesture can be influenced by 3D objects in the foreground before the virtual object arrives at the plane of the screen. These objects may change the direction or velocity of the projectile or destroy it entirely. The object can be rendered by the 3D Image Interaction and Effects Module 805 in the foreground on one or more of the displays.

In a first example embodiment, an apparatus comprises a laser array having a plurality of lasers; and a laser driver coupled to the laser array, wherein the laser driver comprises a current limiter to provide a maximum current at or below a threshold current of lasers in the laser array or at a current level to meet laser safety requirements under circuit failure conditions; one or more capacitors coupled to current limiter and the laser array, where the one or more capacitors are to be charged in response to current from the current limiter; and a switch coupled to the one or more capacitors operable to cause current from the one or more capacitors to flow through the laser array.

In another example embodiment, the subject matter of the first example embodiment can optionally include a timing circuit coupled to control the switch. In another example embodiment, the subject matter of this example embodiment can optionally include that the timing circuit is operable to control the pulse width and pulse period of the current pulse discharged by the one or more capacitors into the laser array.

In another example embodiment, the subject matter of the first example embodiment can optionally include that the current limiter comprises a current limited load switch.

In another example embodiment, the subject matter of the first example embodiment can optionally include that the current limiter comprises one or more resistors.

In another example embodiment, the subject matter of the first example embodiment can optionally include that the switch comprises a transistor. In another example embodiment, the subject matter of this example embodiment can optionally include that the transistor comprises a MOSFET.

In another example embodiment, the subject matter of the first example embodiment can optionally include that the laser array comprises a vertical cavity surface emitting laser (VCSEL) array comprising a plurality of VCSELs.

In a second example embodiment, an apparatus comprises: a projector configured to project a dot pattern on an object, wherein the projector comprises a laser array having a plurality of lasers; and a laser driver coupled to the laser array, wherein the laser driver comprises a current limiter to provide a maximum current at or below a threshold current of lasers in the laser array or at a current level to meet laser safety requirements under circuit failure conditions, one or more capacitors coupled to current limiter and the laser array, the one or more capacitors to be charged in response to current from the current limiter, and a switch coupled to the one or more capacitors operable to cause current from the one or more capacitors to flow through the laser array; first and second cameras configured to simultaneously capture a pair of images of the object illuminated with the dot pattern; and a processing unit to receive the captured pair of images and reconstruct depth information using the captured pair of images.

In another example embodiment, the subject matter of the second example embodiment can optionally include a timing circuit coupled to control the switch. In another example embodiment, the subject matter of this example embodiment can optionally include that the timing circuit is operable to control the pulse width and pulse period of the current pulse discharged by the one or more capacitors into the laser array.

In another example embodiment, the subject matter of the second example embodiment can optionally include that the current limiter comprises a current limited load switch.

In another example embodiment, the subject matter of the second example embodiment can optionally include that the current limiter comprises one or more resistors.

In another example embodiment, the subject matter of the second example embodiment can optionally include that the switch comprises a transistor. In another example embodiment, the subject matter of this example embodiment can optionally include that the transistor comprises a MOSFET.

In another example embodiment, the subject matter of the second example embodiment can optionally include that the laser array comprises a vertical cavity surface emitting laser (VCSEL) array comprising a plurality of VCSELs.

In another example embodiment, the subject matter of the second example embodiment can optionally include that the projector comprises an infrared (IR) projector and each of the first and second cameras comprises an IR camera.

In a third example embodiment, a method comprises charging one or more one or more capacitors coupled to a laser array and controlling a switch to cause the one or more capacitors to discharge a current pulse into the laser array to cause the laser array to emit light.

In another example embodiment, the subject matter of the third example embodiment can optionally include controlling pulse width and pulse duration of the current pulse by controlling the switch.

In another example embodiment, the subject matter of the third example embodiment can optionally include that the laser array comprises a vertical cavity surface emitting laser (VCSEL) array comprising a plurality of VCSELs.

In another example embodiment, the subject matter of the third example embodiment can optionally include projecting a dot pattern on an object using a projector using the light emitted from the laser array; capturing simultaneously, using two camera, a pair of images of the dot pattern; and generating depth information using the pair of images.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising:
   a laser array having a plurality of lasers; and
   a laser driver coupled to the laser array, wherein the laser driver comprises
      a current limiter to limit a maximum current provided to the laser array at or below a combined threshold current of lasers in the laser array;
      one or more capacitors coupled to current limiter and the laser array, the one or more capacitors to be charged in response to current from the current limiter;
      a switch coupled to the one or more capacitors operable to cause current from the one or more capacitors to flow through the laser array.

2. The apparatus defined in claim 1 further comprising a timing circuit coupled to control the switch.

3. The apparatus defined in claim 2 wherein the timing circuit is operable to control a pulse width and pulse period of a current pulse discharged by the one or more capacitors into the laser array.

4. The apparatus defined in claim 1 wherein the current limiter comprises a current limited load switch.

5. The apparatus defined in claim 1 wherein the current limiter comprises one or more resistors.

6. The apparatus defined in claim 1 wherein the switch comprises a transistor.

7. The apparatus defined in claim 6 wherein the transistor comprises a MOSFET.

8. The apparatus defined in claim 1 wherein the laser array comprises a vertical cavity surface emitting laser (VCSEL) array comprising a plurality of VCSELs.

9. An apparatus comprising:
   a projector configured to project a dot pattern on an object, wherein the projector comprises
      a laser array having a plurality of lasers; and
      a laser driver coupled to the laser array, wherein the laser driver comprises
         a current limiter to limit a maximum current provided to the laser array at or below a combined threshold current of lasers in the laser array;
         one or more capacitors coupled to current limiter and the laser array, the one or more capacitors to be charged in response to current from the current limiter;
         a switch coupled to the one or more capacitors operable to cause current from the one or more capacitors to flow through the laser array;
      first and second cameras configured to simultaneously capture a pair of images of the object illuminated with the dot pattern; and
      a processing unit to receive the captured pair of images and reconstruct depth information using the captured pair of images.

10. The apparatus defined in claim 9 further comprising a timing circuit coupled to control the switch.

11. The apparatus defined in claim 10 wherein the timing circuit is operable to control a pulse width and pulse period of a current pulse discharged by the one or more capacitors into the laser array.

12. The apparatus defined in claim 9 wherein the current limiter comprises a current limited load switch.

13. The apparatus defined in claim 9 wherein the current limiter comprises one or more resistors.

14. The apparatus defined in claim 9 wherein the switch comprises a transistor.

15. The apparatus defined in claim 14 wherein the transistor comprises a MOSFET.

16. The apparatus defined in claim 9 wherein the laser array comprises a vertical cavity surface emitting laser (VCSEL) array comprising a plurality of VCSELs.

17. The apparatus defined in claim 9 wherein the projector comprises an infrared (IR) projector and each of the first and second cameras comprises an IR camera.

18. A method comprising:
   limiting a maximum current delivered to one or more capacitors coupled to a laser array by a current limiter at or below a combined threshold current of lasers in the laser array;

charging the one or more capacitors coupled to the laser array using current from the current limiter; and controlling a switch to cause the one or more capacitors to discharge a current pulse into the laser array to cause the laser array to emit light.

19. The method defined in claim 18 further comprising controlling pulse width and pulse duration of the current pulse by controlling the switch.

20. The method defined in claim 18 wherein the laser array comprises a vertical cavity surface emitting laser (VCSEL) array comprising a plurality of VCSELs.

21. The method defined in claim 18 further comprising:

projecting a dot pattern on an object using a projector using the light emitted from the laser array;

capturing simultaneously, using two camera, a pair of images of the dot pattern; and generating depth information using the pair of images.

* * * * *